(12) United States Patent
Nagano et al.

(10) Patent No.: US 8,229,047 B2
(45) Date of Patent: Jul. 24, 2012

(54) COMPLEX SIGNAL PROCESSING CIRCUIT, RECEIVER CIRCUIT, AND SIGNAL REPRODUCTION DEVICE

(75) Inventors: Kouichi Nagano, Osaka (JP); Hiroyuki Nakahira, Osaka (JP); Takashi Yamamoto, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/070,221

(22) Filed: Mar. 23, 2011

(65) Prior Publication Data

US 2011/0170643 A1    Jul. 14, 2011

Related U.S. Application Data

(63) Continuation of application No. PCT/JP2009/000415, filed on Feb. 3, 2009.

(30) Foreign Application Priority Data

Sep. 26, 2008   (JP) .................................. 2008-249016

(51) Int. Cl.
  *H03D 1/04* (2006.01)
  *H04B 1/10* (2006.01)
(52) U.S. Cl. ..................... 375/346; 375/324; 375/340
(58) Field of Classification Search ................. 375/324, 375/340, 346–350
  See application file for complete search history.

(56) References Cited

U.S. PATENT DOCUMENTS

| | | | |
|---|---|---|---|
| 6,304,751 | B1 | 10/2001 | King |
| 7,146,148 | B2 | 12/2006 | Ide |
| 2002/0065060 | A1 | 5/2002 | Minnis et al. |
| 2005/0090219 | A1 | 4/2005 | Kang et al. |
| 2005/0147184 | A1 | 7/2005 | Matsuno |
| 2006/0058001 | A1 | 3/2006 | Minnis et al. |
| 2007/0080835 | A1* | 4/2007 | Maeda et al. .................. 341/120 |
| 2007/0291883 | A1* | 12/2007 | Welz et al. ..................... 375/350 |

FOREIGN PATENT DOCUMENTS

| | | |
|---|---|---|
| JP | 10-056484 | 2/1998 |
| JP | 2001-016121 | 1/2001 |
| JP | 2003-283354 | 10/2003 |
| JP | 2003-309612 | 10/2003 |
| JP | 2003-318759 | 11/2003 |
| JP | 2004-128694 | 4/2004 |
| WO | WO 02/43259 A2 | 5/2002 |

* cited by examiner

*Primary Examiner* — Curtis Odom
(74) *Attorney, Agent, or Firm* — McDermott Will & Emery LLP

(57) ABSTRACT

An analog complex filter combines an in-phase signal and a quadrature signal to output first and second analog signals. An analog-to-digital converter converts the first and second analog signals into first and second digital signals. A first digital complex filter attenuates a component corresponding to the quadrature signal of the first digital signal and outputs the resultant signal as a third digital signal, and attenuates a component corresponding to the in-phase signal of the second digital signal and outputs the resultant signal as a fourth digital signal. An IQ imbalance correction circuit corrects a quadrature error and an amplitude error between the third and fourth digital signals.

12 Claims, 8 Drawing Sheets

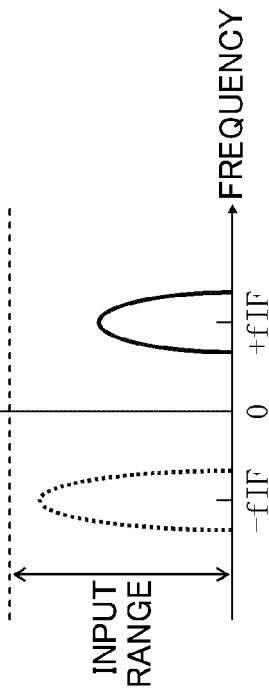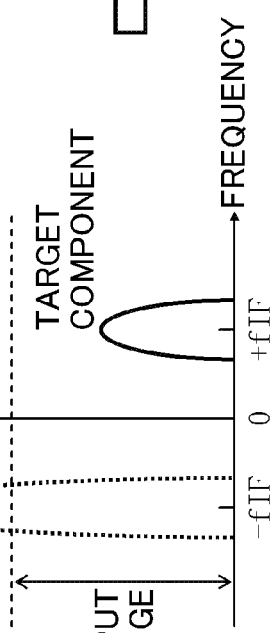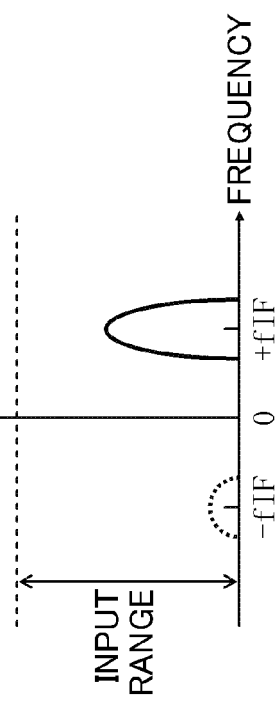

US 8,229,047 B2

COMPLEX SIGNAL PROCESSING CIRCUIT, RECEIVER CIRCUIT, AND SIGNAL REPRODUCTION DEVICE

CROSS-REFERENCE TO RELATED APPLICATIONS

This is a continuation of PCT International Application PCT/JP2009/000415 filed on Feb. 3, 2009, which claims priority to Japanese Patent Application No. 2008-249016 filed on Sep. 26, 2008. The disclosures of these applications including the specifications, the drawings, and the claims are hereby incorporated by reference in their entirety.

BACKGROUND

The technology disclosed herein refers to complex signal processing circuits which process a complex signal including an in-phase signal and a quadrature signal, and more particularly, to techniques of improving the accuracy of correction of a quadrature error and an amplitude error between an in-phase signal and a quadrature signal in complex signal processing circuits including an analog complex filter.

Conventionally, in the field of wireless communication, there is a technique called low-IF reception in which a radio frequency signal (RF signal) is downconverted into an intermediate frequency signal (IF signal) having a frequency in the vicinity of a baseband. In the low-IF reception, the IF signal has the reduced frequency and therefore the number of parts can be reduced, whereby the integration density of a receiver system can be increased, compared to a standard superheterodyne technique.

FIG. 8 shows a configuration of a conventional low-IF receiver circuit. A quadrature detector 93 multiplies a radio frequency signal RF which has been passed through a low-noise amplifier (LNA) 91 by a local signal LOi output from a local oscillator (LO) 92 to output an in-phase signal I90, and multiplies the radio frequency signal RF by a local signal LOq to output a quadrature signal Q90. Thus, the radio frequency signal RF is converted into an intermediate frequency signal (an analog complex signal (I90+jQ90) including the in-phase signal I90 and the quadrature signal Q90). Note that "j" is the imaginary unit. Note that, in the description that follows, a complex signal including an in-phase signal Ix and a quadrature signal Qx is represented as (Ix+jQx).

The radio frequency signal RF may contain an image component. The frequency of the image component and the frequency of a target component are located on the frequency axis at positions symmetrical with respect to the frequency of the local signal LOi. Therefore, the image component and the target component are mixed together due to frequency conversion performed by the quadrature detector 93, so that the image component can no longer be separated from the target component. Therefore, the image component needs to have been sufficiently attenuated in the analog complex signal (I90+jQ90). Such a technique of rejecting the image component is described in Japanese Patent Publication No. 2003-283354 etc.

Analog-to-digital converters (ADCs) 94i and 94q each convert the in-phase signal I90 and the quadrature signal Q90 into digital signals, i.e., an in-phase signal I92 and a quadrature signal Q92, respectively. An IQ imbalance correction circuit (IQ) 95 corrects a quadrature error and an amplitude error (IQ imbalance) between the in-phase signal I92 and the quadrature signal Q92, and outputs the results as an in-phase signal I93 and a quadrature signal Q93. A digital complex filter (DCF) 96 applies a complex operation to the in-phase signal I93 and the quadrature signal Q93 output from the IQ imbalance correction circuit 95 in order to reject the image component of the digital complex signal (I93+jQ93), and outputs the results as an in-phase signal I94 and a quadrature signal Q94, respectively. A digital signal processing circuit (DSP) 97 demodulates data based on the output of the digital complex filter 96.

By thus correcting the IQ imbalance using the IQ imbalance correction circuit 95, the image rejection ratio of the digital complex filter 96 can be improved. Such an IQ imbalance correction technique is described in Japanese Patent Publication Nos. H10-56484 and 2003-309612, etc.

When, however, an image rejection ratio desired for the analog complex signal (I90+jQ90) (i.e., the difference in image component signal level between the analog complex signal (I90+jQ90) and the digital complex signal (I94+jQ94)) is larger than the input range (i.e., the difference between the maximum input level and the noise level) of the analog-to-digital converters 94i and 94q, the analog-to-digital converters 94i and 94q cannot accurately convert the analog complex signal (I90+jQ90).

As shown in FIG. 9, therefore, an analog complex filter 90 for attenuating the image component of the analog complex signal (I90+jQ90) is provided at a stage preceding the analog-to-digital converters 94i and 94q. The analog complex filter 90 combines the in-phase signal I90 and the quadrature signal Q90 to output an in-phase signal I91 and a quadrature signal Q91.

SUMMARY

In the conventional receiver circuit of FIG. 9, however, the in-phase signal I91 and the quadrature signal Q91 output from the analog complex filter 90 each contain an unnecessary component. Specifically, the analog complex signal (I91+jQ91) is defined as $$(I91 + jQ91) = (I90 + jQ90) \times (H91(s) + jH92(s))$$
$$= (H91(s)I90 - H92(s)Q90) + j(H92(s)I90 + H91(s)Q90)$$

where $(H91(s)+jH92(s))$ is the transfer function of the analog complex filter 90.

Thus, the in-phase signal I91 and the quadrature signal Q91 are $$I91 = H91(s)I90 - H92(s)Q90$$

$$Q91 = H92(s)I90 + H91(s)Q90.$$

Thus, the in-phase signal I91 contains an in-phase component (a component corresponding to the in-phase signal I90) and, in addition, a quadrature component (a component corresponding to the quadrature signal Q90). Similarly, the quadrature signal Q91 contains a quadrature component, and in addition, an in-phase component. Therefore, the IQ imbalance correction circuit 95 cannot accurately correct the quadrature error and the amplitude error (IQ imbalance) between the in-phase signal I92 and the quadrature signal Q92. Because the IQ imbalance cannot be accurately corrected, it is difficult to improve the image rejection ratio of the digital complex filter 96.

The present disclosure describes implementations of a technique of improving the accuracy of correction of the IQ imbalance in a complex signal processing circuit including an analog complex filter.

An example complex signal processing circuit for processing an analog complex signal including an in-phase signal and a quadrature signal, includes an analog complex filter configured to combine the in-phase signal with the quadrature signal and output the resultant signal as a first analog signal, and combine the quadrature signal with the in-phase signal and output the resultant signal as a second analog signal, to attenuate an image component contained in the analog complex signal, an analog-to-digital converter configured to convert the first and second analog signals into first and second digital signals, a first digital complex filter configured to apply a complex operation to the first and second digital signals to attenuate a component corresponding to the quadrature signal of the first digital signal and output the resultant signal as a third digital signal, and attenuate a component corresponding to the in-phase signal of the second digital signal and output the resultant signal as a fourth digital signal, and an IQ imbalance correction circuit configured to correct a quadrature error and an amplitude error between the third and fourth digital signals. In the complex signal processing circuit, the first digital complex filter attenuates an unnecessary component in each of the first and second digital signals, whereby the IQ imbalance correction circuit can accurately correct a quadrature error and an amplitude error between the third and fourth digital signals.

The complex signal processing circuit preferably further includes a second digital complex filter configured to reject an image component contained in a digital complex signal including the third and fourth digital signals corrected by the IQ imbalance correction circuit. In the complex signal processing circuit, the IQ imbalance between the third and fourth digital signals can be accurately corrected, whereby the image rejection ratio of the second digital complex filter can be improved.

In the complex signal processing circuit, it is preferable that $$|H1(s)H4(z)+H2(s)H3(z)|<|H2(s)|, \text{ and}$$

$$|H1(s)H4(z)+H2(s)H3(z)|<|H1(s)H3(z)-H2(s)H4(z)|$$

where $(H1(s)+jH2(s))$ is an analog transfer function of the analog complex filter, $(H3(z)+jH4(z))$ is an digital transfer function of the first digital complex filter, and j is the imaginary unit.

In this case, a quadrature component contained in the third digital signal can be caused to be smaller than a quadrature component contained in the first digital signal, and an in-phase component contained in the fourth digital signal can be caused to be smaller than an in-phase component contained in the second digital signal.

Moreover, it is preferable that $H1(s)H4(z)+H2(s)H3(z)=0$. In this case, the quadrature component contained in the third digital signal and the in-phase component contained in the fourth digital signal can be minimized.

BRIEF DESCRIPTION OF THE DRAWINGS

FIGS. 3A-3C are diagrams for describing operation of a complex signal processing circuit shown in FIG. 1.

DETAILED DESCRIPTION

Figure 1:
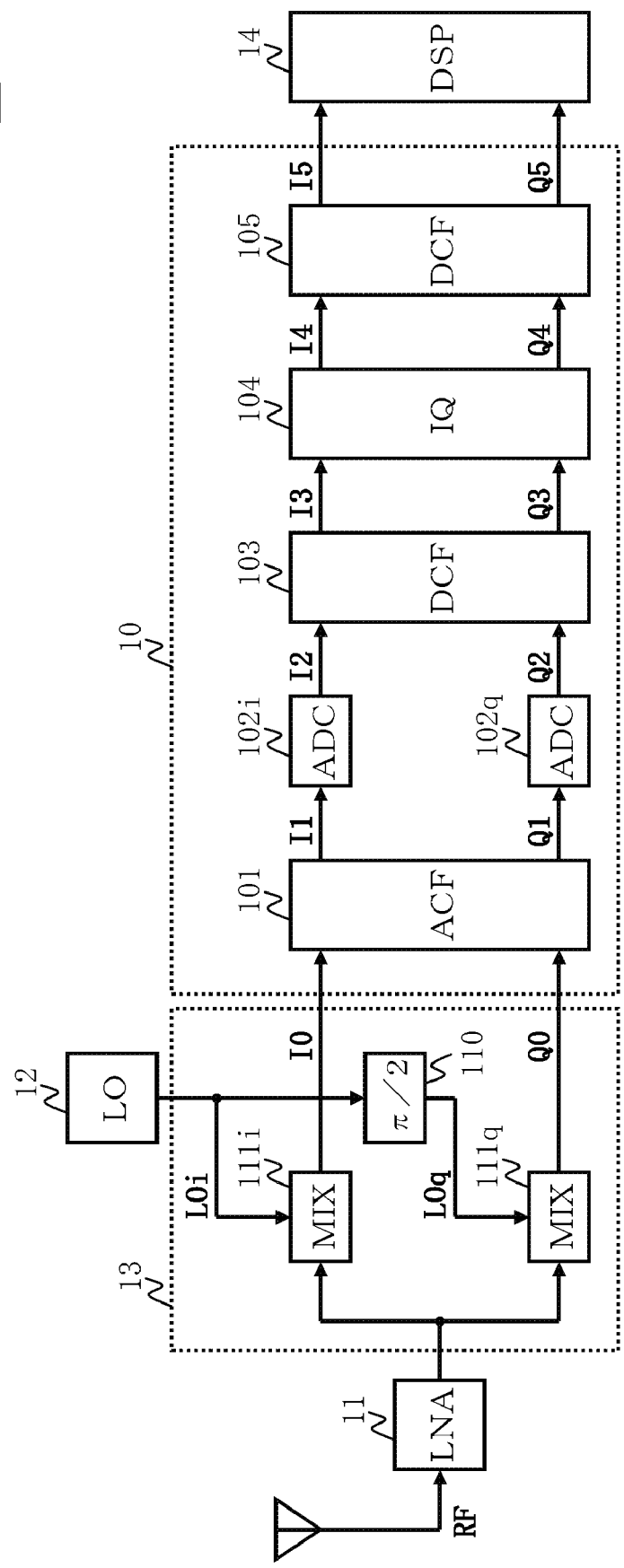
FIG. 1 is a diagram showing an example configuration of a receiver circuit according to a first embodiment.

Embodiments of the present disclosure will be described in detail hereinafter with reference to the accompanying drawings. In the drawings, similar reference characters refer to the same or similar elements, and the explanation thereof will be omitted.

(First Embodiment)

FIG. 1 shows an example configuration of a receiver circuit according to a first embodiment. The receiver circuit 1 demodulates data (e.g., video data, audio data, etc.) from a radio frequency signal RF. Examples of the receiver circuit 1 include a radio tuner, a digital television tuner, etc. The receiver circuit 1 includes a low-noise amplifier (LNA) 11, a local oscillator (LO) 12, a quadrature detector 13, a complex signal processing circuit 10, and a digital signal processing circuit (DSP) 14. Note that, here, it is assumed that the receiver circuit 1 is a low-IF receiver.

The low-noise amplifier 11 amplifies a radio frequency signal RF received by an antenna. The local oscillator 12 outputs a local signal LOi. The frequency of the local signal LOi is lower than that of the radio frequency signal RF. The quadrature detector 13 multiplies the radio frequency signal RF amplified by the low-noise amplifier 11 by the local signal LOi to output an in-phase signal I0, and multiplies the radio frequency signal RF by a local signal LOq (a signal which is out of phase with the local signal LOi by $\pi/2$) to output a quadrature signal Q0. For example, the quadrature detector 13 includes a phase shifter 110 which delays the local signal LOi by ($\pi/2$) to output the result as the local signal LOq, a mixer (MIX) 111$i$ which multiplies the radio frequency signal RF by the local signal LOi, and a mixer 111$q$ which multiplies the radio frequency signal RF by the local signal LOq. Thus, the radio frequency signal RF is converted into an intermediate frequency signal (an analog complex signal (I0+jQ0)) including the in-phase signal I0 and the quadrature signal Q0.

The complex signal processing circuit 10 processes the analog complex signal (I0+jQ0) output from the quadrature detector 13 to output a digital complex signal (I5+jQ5). The digital signal processing circuit 14 demodulates data based on the digital complex signal (I5+jQ5) output from the complex signal processing circuit 10.

[Complex Signal Processing Circuit]

The complex signal processing circuit 10 includes an analog complex filter (ACF) 101, analog-to-digital converters (ADCs) 102$i$ and 102$q$, a digital complex filter (DCF) 103, an IQ imbalance correction circuit (IQ) 104, and a digital complex filter 105.

Figure 2A:
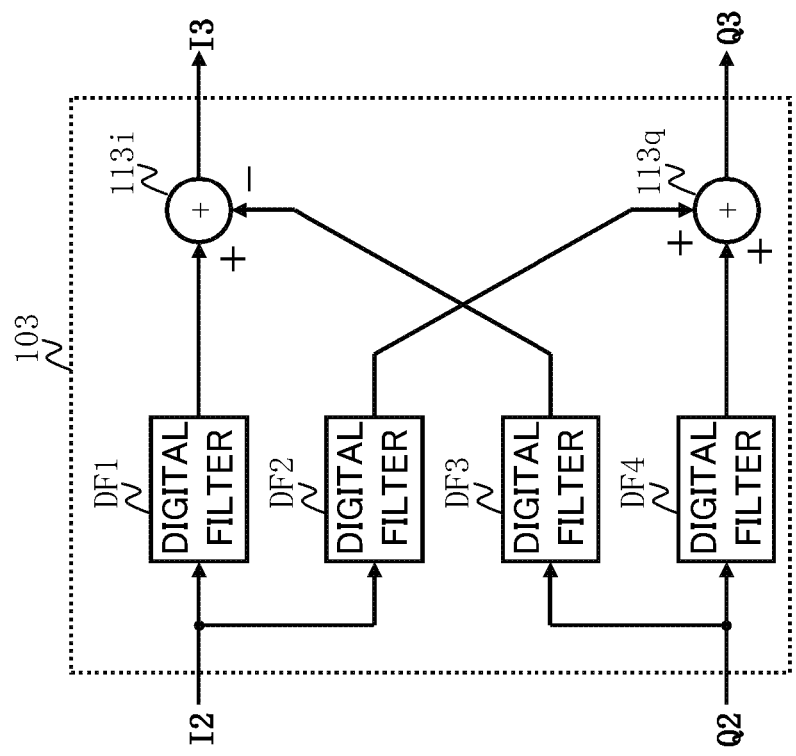
FIG. 2A is a diagram showing an example internal configuration of an analog complex filter shown in FIG. 1.

In order to attenuate the image component of the analog complex signal (I0+jQ0), the analog complex filter 101 combines the in-phase signal I0 with the quadrature signal Q0 and outputs the result as an in-phase signal I1, and combines the quadrature signal Q0 with the in-phase signal I0 and outputs the result as a quadrature signal Q1. For example, as shown in FIG. 2A, the analog complex filter 101 includes transconductance amplifiers T1, T2, and T3 having a positive transconductance, a transconductance amplifier T4 having a negative transconductance, and capacitors C1 and C2.

The analog-to-digital converter 102i converts the in-phase signal I1 into a digital signal (in-phase signal I2). The analog-to-digital converter 102q converts the quadrature signal Q1 into a digital signal (quadrature signal Q2).

Figure 2B:
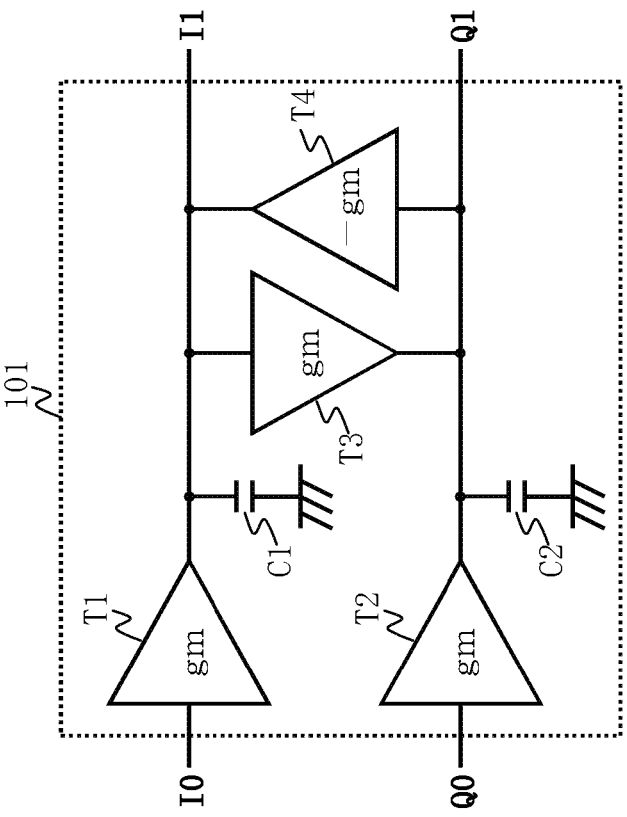
FIG. 2B is a diagram showing an example internal configuration of a digital complex filter shown in FIG. 1.

The digital complex filter 103 applies a complex operation to the in-phase signal I2 and the quadrature signal Q2, and outputs the results of the operation as an in-phase signal I3 and a quadrature signal Q3. For example, as shown in FIG. 2B, the digital complex filter 103 includes digital filters DF1, DF2, DF3, and DF4 including an IIR filter, an FIR filter, etc., and adders 113i and 113q.

The IQ imbalance correction circuit 104 corrects a quadrature error and an amplitude error (IQ imbalance) between the in-phase signal I3 and the quadrature signal Q3, and outputs the corrected in-phase signal I3 and quadrature signal Q3 as an in-phase signal I4 and a quadrature signal Q4.

In order to reject the image component of the digital complex signal (I4+jQ4), the digital complex filter 105 applies a complex operation to the in-phase signal I4 and the quadrature signal Q4, and outputs the results of the operation as an in-phase signal I5 and a quadrature signal Q5.

[Operation]

Next, operation of the complex signal processing circuit 10 of FIG. 1 will be described with reference to FIGS. 3A, 3B, and 3C.

Initially, the quadrature detector 13 converts the radio frequency signal RF into the analog complex signal (I0+jQ0). As shown in FIG. 3A, the analog complex signal (I0+jQ0) contains a target component corresponding to a target frequency (+fIF) and an image component corresponding to an image frequency (−fIF).

Next, the analog complex filter 101 attenuates the image component contained in the analog complex signal (I0+jQ0) and outputs the result as an analog complex signal (I1+jQ1). As shown in FIG. 3B, the signal level of the image component included in the analog complex signal (I1+jQ1) falls within the input range of the analog-to-digital converters 102i and 102q.

Next, the analog complex signal (I1+jQ1) is processed and converted into the digital complex signal (I5+jQ5) by the analog-to-digital converters 102i and 102q, the digital complex filter 103, the IQ imbalance correction circuit 104, and the digital complex filter 105. As shown in FIG. 3C, an image component contained in the digital complex signal (I5+jQ5) is rejected by the complex operation of the digital complex filter 105.

[Process by Digital Complex Filter]

Next, a process performed by the digital complex filter 103 will be described. Note that the transfer functions of the analog complex filter 101 and the digital complex filter 103 are represented by the analog transfer function of the analog complex filter 101: $H1(s)+jH2(s)$ a transfer function obtained by applying the bilinear transform to the analog transfer function: $H1(z)+jH2(z)$ the digital transfer function of the digital complex filter 103: $H3(z)+jH4(z)$.

Here, it is assumed that the real part $H3(z)$ of the digital transfer function corresponds to the real part $H1(z)$ of the transfer function $(H1(z)+jH2(z))$, and the imaginary part $H4(z)$ of the digital transfer function corresponds to the sign-reversed version $(-H2(z))$ of the imaginary part $H2(z)$ of the transfer function $(H1(z)+jH2(z))$.

The analog complex filter 101 applies the following complex operation to the analog complex signal (I0+jQ0) to output the analog complex signal (I1+jQ1):

$$(I1+jQ1) = (H1(s)+jH2(s)) \times (I0+jQ0)$$
$$= (H1(s)I0 - H2(s)Q0) + j(H2(s)I0 + H1(s)Q0).$$

Specifically, the in-phase signal I1 and the quadrature signal Q1 are as follows.

$$I1 = H1(s)I0 - H2(s)Q0 \quad (1)$$

$$Q1 = H2(s)I0 + H1(s)Q0 \quad (2)$$

Next, the analog-to-digital converters 102i and 102q convert the analog complex signal (I1+jQ1) into a digital complex signal (I2+jQ2). Next, the digital complex filter 103 applies the following complex operation to the digital complex signal (I2+jQ2) to output a digital complex signal (I3+jQ3).

$$(I3+jQ3) = (H3(z)+jH4(z)) \times (I2+jQ2) \quad (3)$$

Because I2=I1 and Q2=Q1, the in-phase signal I3 and the quadrature signal Q3 are obtained by expressions (1), (2), and (3) as follows.

$$I3 = (H1(s)H3(z) - H2(s)H4(z))I0 - (H1(s)H4(z) + H2(s)H3(z))Q0 \quad (4)$$

$$Q3 = (H1(s)H4(z) + H2(s)H3(z))I0 + (H1(s)H3(z) - H2(s)H4(z))Q0 \quad (5)$$

Here, because $H3(z) = H1(z) \approx H1(s)$ and $H4(z) = -H2(z) \approx -H2(s)$, one has the following.

$$H1(s)H4(z) + H2(s)H3(z) \approx 0 \quad (6)$$

Therefore, the in-phase signal I3 and the quadrature signal Q3 are obtained by expressions (4), (5), and (6) that as follows.

$$I3 \approx (H1(s)H3(z) - H2(s)H4(z))I0 \quad (7)$$

$$Q4 \approx (H1(s)H3(z) - H2(s)H4(z))Q0 \quad (8)$$

Thus, the term relating to the quadrature signal Q0 is removed from the in-phase signal I3, and the term relating to the in-phase signal J0 is removed from the quadrature signal Q3.

As described above, the digital complex filter 103 attenuates the quadrature component (a component corresponding to the quadrature signal Q0) of the in-phase signal I2 and outputs the resultant in-phase signal I2 as the in-phase signal I3, and attenuates the in-phase component (a component corresponding to the in-phase signal J0) of the quadrature signal Q2 and outputs the resultant quadrature signal Q2 as the quadrature signal Q3. Thus, the unnecessary component is reduced in each of the in-phase signal I3 and the quadrature signal Q3, and therefore, the IQ imbalance correction circuit 104 can accurately correct a quadrature error and an amplitude error between the in-phase signal I3 and the quadrature signal Q3. Also, the IQ imbalance can be accurately corrected, whereby the image rejection ratio of the digital complex filter 105 can be improved.

Moreover, the improvement of the image rejection ratio of the digital complex filter 105 allows the digital signal processing circuit 14 to accurately demodulate data based on the complex signal (I5+jQ5) output from the digital complex filter 105.

(Transfer Function)

Note that the transfer functions of the analog complex filter 101 and the digital complex filter 103 may be set so that the following expressions are satisfied.

$$|H1(s)H4(z)+H2(s)H3(z)|<|H2(s)| \quad (9)$$

$$|H1(s)H4(z)+H2(s)H3(z)|<|H1(s)H3(z)-H2(s)H4(z)| \quad (10)$$

By thus setting the transfer functions, a quadrature component contained in the in-phase signal I3 can be caused to be smaller than a quadrature component contained in the in-phase signal I2, and an in-phase component contained in the quadrature signal Q3 can be caused to be smaller than an in-phase component contained in the quadrature signal Q2. As a result, the accuracy of correction of the IQ imbalance can be improved.

As can be seen from expressions (4) and (5), as "H1(s)H4(z)+H2(s)H3(z)" is closer to "0," an unnecessary component contained in each of the in-phase signal I3 and the quadrature signal Q3 decreases. In particular, by setting the transfer functions of the analog complex filter 101 and the digital complex filter 103 so that "H1(s)H4(z)+H2(s)H3(z)=0" is satisfied, the quadrature component contained in the in-phase signal I3 and the in-phase component contained in the quadrature signal Q3 can be minimized.

(Second Embodiment)

Figure 4:
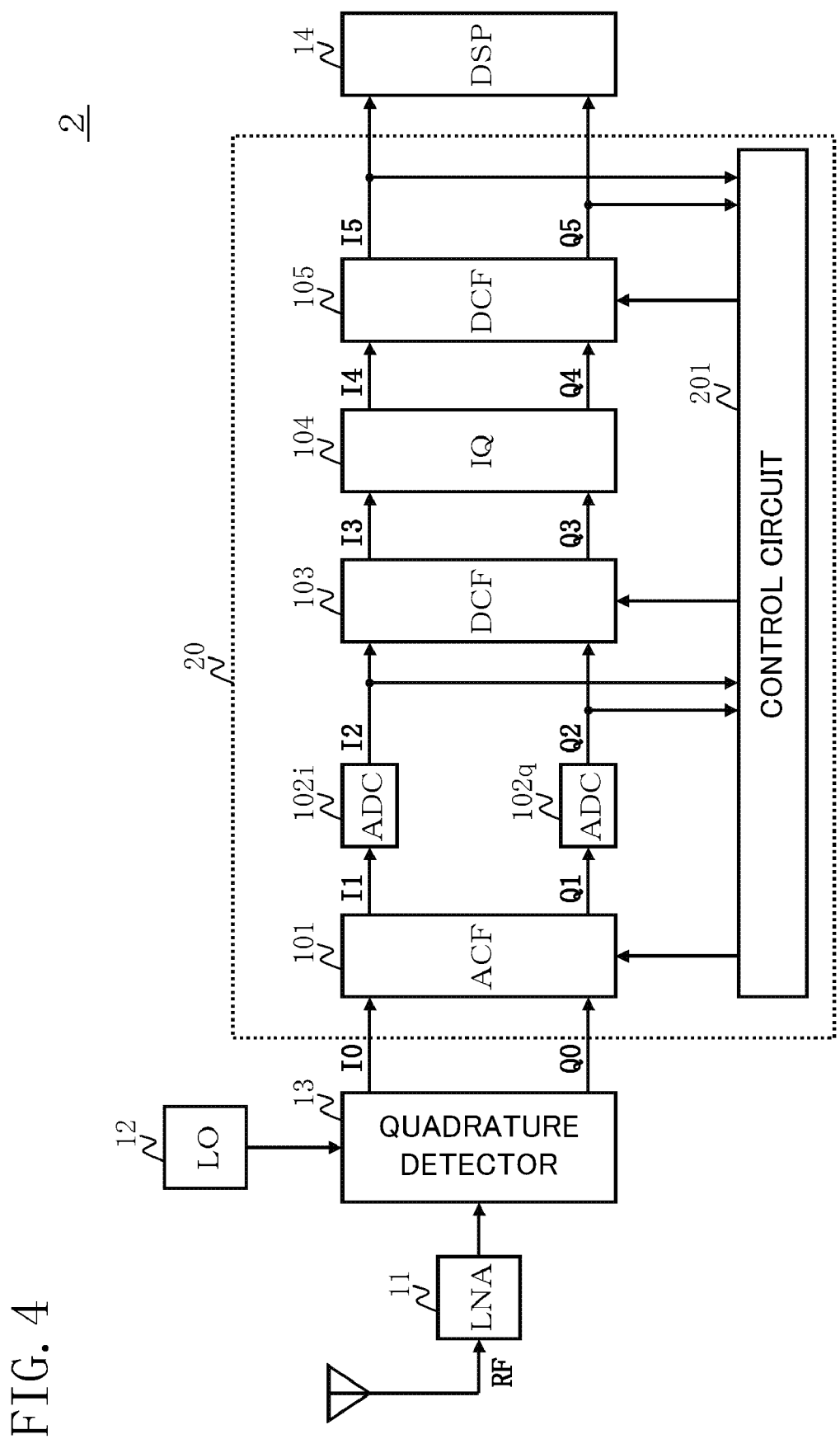
FIG. 4 is a diagram showing an example configuration of a receiver circuit according to a second embodiment.

FIG. 4 shows an example configuration of a receiver circuit according to a second embodiment. The receiver circuit 2 includes a complex signal processing circuit 20 instead of the complex signal processing circuit 10 of FIG. 1. The other components are similar to those of FIG. 1. The complex signal processing circuit 20 includes a control circuit 201 in addition to the components of FIG. 1. The control circuit 201 controls operation of the analog complex filters 101 and the digital complex filters 103 and 105 based on the digital complex signals (I2+jQ2) and (I5+jQ5).

[Operation Control 1]

Next, a control of operation of the analog complex filter 101 and the digital complex filter 103 by the control circuit 201 of FIG. 4 will be described.

Initially, the control circuit 201 calculates the signal level of an image component contained in the analog complex signal (I0+jQ0) based on the digital complex signal (I2+jQ2) and the image rejection ratio of the analog complex filter 101. The control circuit 201 also calculates the signal level of an image component contained in the digital complex signal (I5+jQ5) based on the digital complex signal (I5+jQ5). Next, the control circuit 201 calculates the difference in image component signal level between the analog complex signal (I0+jQ0) and the digital complex signal (I5+jQ5) (i.e., an image rejection ratio with respect to the analog complex signal (I0+jQ0)). Thereafter, the control circuit 201 determines whether or not the image rejection ratio with respect to the analog complex signal (I0+jQ0) is larger than the input range of the analog-to-digital converters 102i and 102q.

When the image rejection ratio with respect to the analog complex signal (I0+jQ0) is larger than the input range of the analog-to-digital converters 102i and 102q, the control circuit 201 keeps active the analog complex filter 101 and the digital complex filter 103.

On the other hand, when the image rejection ratio with respect to the analog complex signal (I0+jQ0) is smaller than the input range of the analog-to-digital converters 102i and 102q, the control circuit 201 inactivates the analog complex filter 101 and the digital complex filter 103. The analog complex filter 101, when inactive, directly outputs the in-phase signal I0 and the quadrature signal Q0 as the in-phase signal I1 and the quadrature signal Q1. The digital complex filter 103, when inactive, directly outputs the in-phase signal I2 and the quadrature signal Q2 as the in-phase signal I3 and the quadrature signal Q3.

As described above, by causing the analog complex filter 101 and the digital complex filter 103 to be inactive when it is not necessary to attenuate an image component contained in the analog complex signal (I0+jQ0), the unnecessary power consumption of the filters can be reduced, and moreover, noise occurring due to unnecessary operation of the filters can be reduced or prevented.

[Operation Control 2]

Next, a control of operation of the digital complex filter 105 by the control circuit 201 of FIG. 4 will be described.

Initially, the control circuit 201 calculates the signal level of an image component contained in the digital complex signal (I4+jQ4) based on the digital complex signal (I2+jQ2) and the image rejection ratio of the digital complex filter 103. The control circuit 201 also calculates the signal level of an image component contained in the digital complex signal (I5+jQ5) based on the digital complex signal (I5+jQ5). Next, the control circuit 201 calculates the difference in image component signal level between the digital complex signal (I4+jQ4) and the digital complex signal (I5+jQ5).

When the signal level difference is larger than a predetermined value (e.g., "0"), the control circuit 201 keeps active the digital complex filter 105. On the other hand, when the signal level difference is smaller than the predetermined value, the control circuit 201 inactivates the digital complex filter 105. The digital complex filter 105, when inactive, directly outputs the in-phase signal I4 and the quadrature signal Q4 as the in-phase signal I5 and the quadrature signal Q5.

As described above, by causing the digital complex filter 105 to be inactive when it is not necessary to reject an image component contained in the digital complex signal (I4+jQ4), the unnecessary power consumption of the digital complex filter 105 can be reduced, and moreover, noise occurring due to unnecessary operation of the digital complex filter 105 can be reduced or prevented.

Note that the control circuit 201 may calculate the signal level of an image component contained in the analog complex signal (I0+jQ0) or the signal level of an image component contained in the digital complex signal (I4+jQ4) based on the digital complex signal (I3+jQ3) or the digital complex signal (I4+jQ4).

(Third Embodiment)

Figure 5:
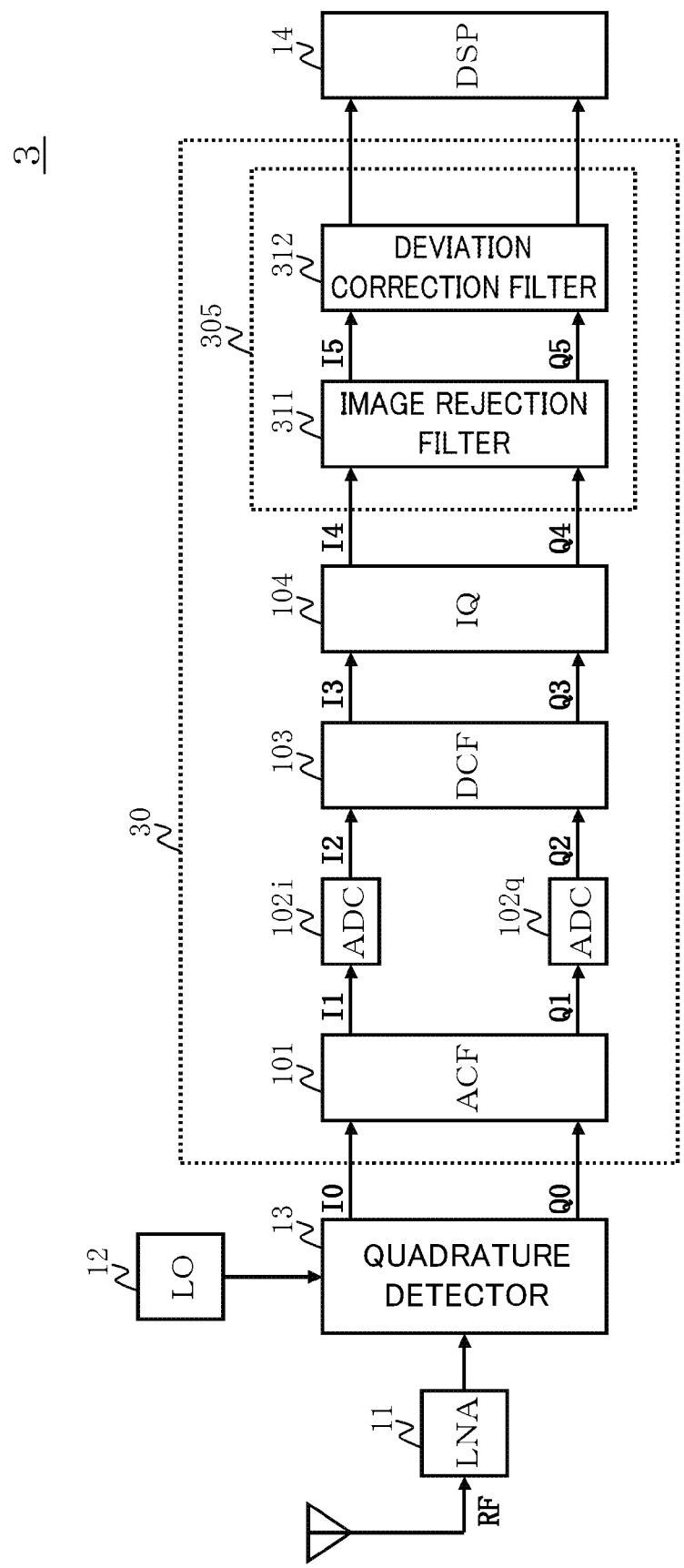
FIG. 5 is a diagram showing an example configuration of a receiver circuit according to a third embodiment.

FIG. 5 shows an example configuration of a receiver circuit according to a third embodiment. The receiver circuit 3 includes a complex signal processing circuit 30 instead of the complex signal processing circuit 10 of FIG. 1. The complex signal processing circuit 30 includes a digital complex filter 305 instead of the digital complex filter 105 of FIG. 1. The other components are similar to those of FIG. 1. The digital complex filter 305 includes an image rejection filter 311 and a deviation correction filter 312.

The image rejection filter 311 applies a complex operation to the in-phase signal I4 and the quadrature signal Q4 in order to reject an image component contained in the digital complex signal (I4+jQ4), and outputs the results of the operation as the in-phase signal I5 and the quadrature signal Q5. For example, the image rejection filter 311 includes a digital complex filter.

The deviation correction filter 312 has amplitude characteristics which cancel an amplitude deviation of the digital complex signal (I5+jQ5), thereby correcting the amplitude deviation of the digital complex signal (I5+jQ5) in a desired frequency band. For example, the deviation correction filter 312 includes a digital complex filter. Note that the transfer function of the deviation correction filter 312 may be set as follows. Specifically, amplitude characteristics in the desired frequency band may be calculated for each block of the receiver circuit 3 (specifically, blocks from the antenna to the image rejection filter 311). The transfer function of the deviation correction filter 312 may be set so that the amplitude characteristics of the deviation correction filter 312 are an inverted version of amplitude characteristics which are obtained by combining the amplitude characteristics of the blocks.

Figure 6:
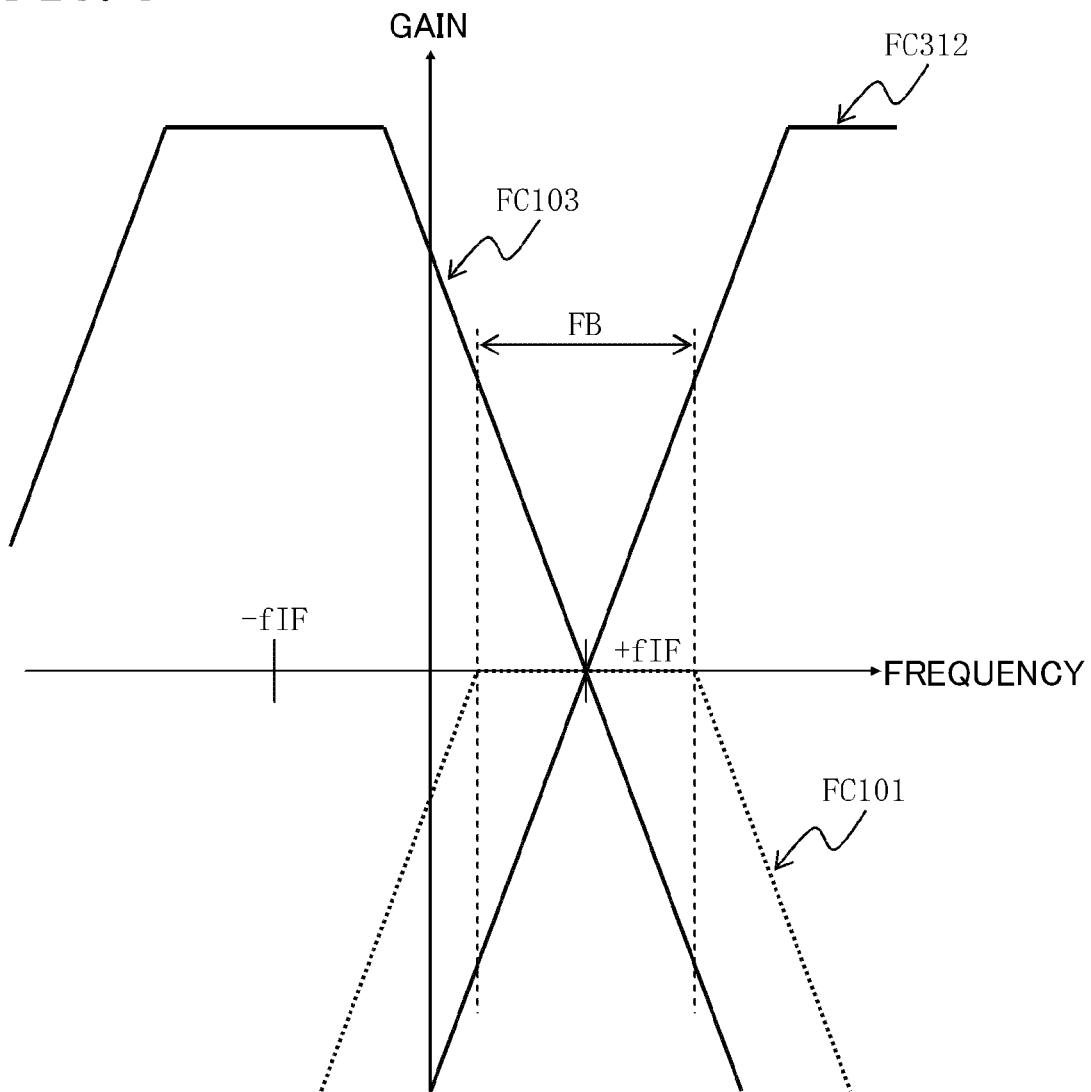
FIG. 6 is a diagram for describing a process performed by a deviation correction filter shown in FIG. 5.

Next, the amplitude characteristics of the deviation correction filter 312 of FIG. 5 will be described with reference to FIG. 6. Note that, in FIG. 6, for the sake of simplicity, only the amplitude characteristics of the analog complex filter 101, the digital complex filter 103, and the deviation correction filter 312 are shown.

The analog complex filter 101 has amplitude characteristics FC101 that the gain is "0" in a desired frequency band FB. The image rejection filter 311 has similar amplitude characteristics. The digital complex filter 103, however, has amplitude characteristics FC103 that the gain decreases with an increase in frequency in the desired frequency band FB. Therefore, the digital complex signal (I5+jQ5) has an amplitude deviation in the desired frequency band FB.

On the other hand, the deviation correction filter 312 has amplitude characteristics FC312 that the gain increases with an increase in frequency in the desired frequency band FB. In other words, the amplitude characteristics FC312 of the deviation correction filter 312 are an inverted version of amplitude characteristics which are obtained by combining the amplitude characteristics of the analog complex filter 101, the digital complex filter 103, and the image rejection filter 311. As a result, the amplitude deviation of the digital complex signal (I5+jQ5) can be corrected.

As described above, by correcting the amplitude deviation of the digital complex signal (I5+jQ5), variations in the signal level of a complex signal in a frequency band can be reduced or prevented. As a result, a degradation in quality of the complex signal can be reduced or prevented.

Note that a single digital complex filter may be used as both the image rejection filter 311 and the deviation correction filter 312. For example, such a digital complex filter has a transfer function which is obtained by combining the transfer functions of the image rejection filter 311 and the deviation correction filter 312. The complex signal processing circuit 30 may further include the control circuit 201 of FIG. 4.

(Signal Reproduction Device)

Figure 7:
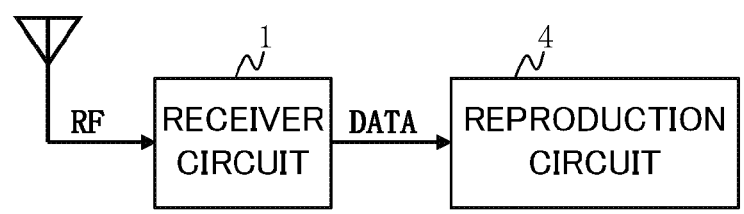
FIG. 7 is a diagram showing an example configuration of a signal reproduction device including the receiver circuit of FIG. 1.
Figure 8:
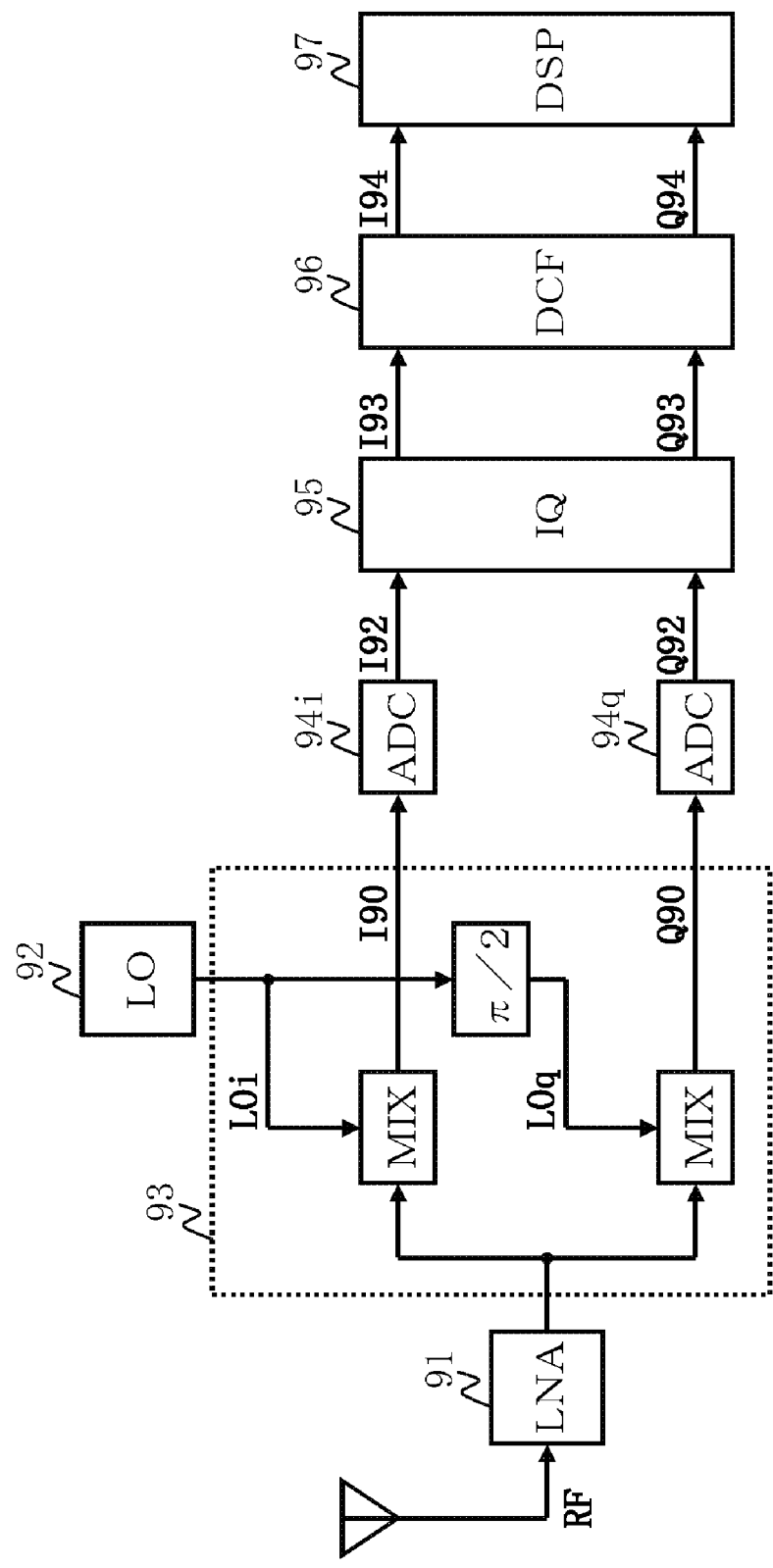
FIG. 8 is a diagram showing a configuration of a conventional receiver circuit.
Figure 9:
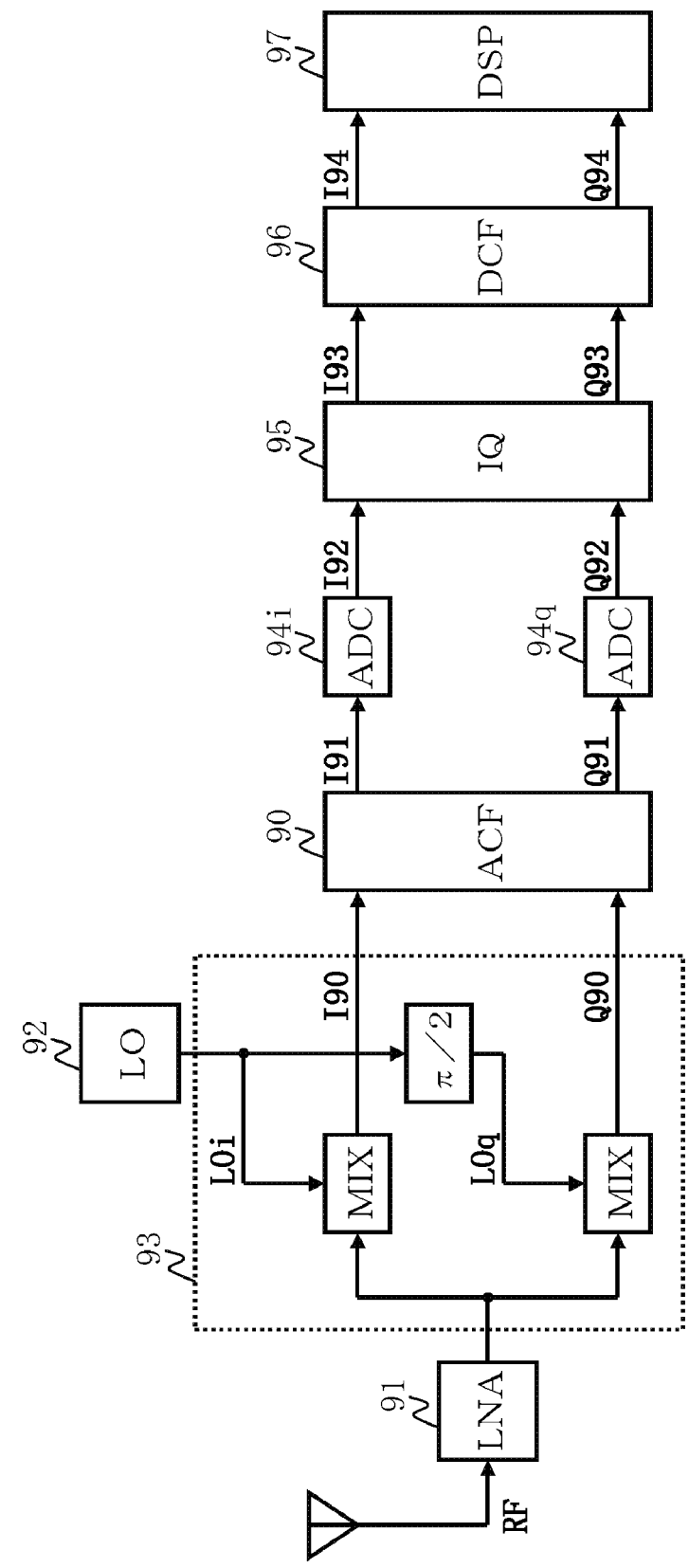
FIG. 9 is a diagram showing a configuration of a conventional receiver circuit including an analog complex filter.

As shown in FIG. 7, the receiver circuits 1, 2, and 3 are applicable to a signal reproduction device. The signal reproduction device of FIG. 7 receives a radio frequency signal RF and reproduces at least one of video and audio. Examples of the signal reproduction device include audio/video reproduction devices, such as a mobile telephone, a digital television, etc., audio reproduction devices, such as a radio etc., etc. The signal reproduction device includes a reproduction circuit 4 in addition to the receiver circuit 1. The reproduction circuit 4 reproduces at least one of video and audio based on data DATA demodulated by the receiver circuit 1. In the signal reproduction device, data is accurately demodulated by the receiver circuit 1, and therefore, the reproduction circuit 4 can accurately reproduce video and/or audio.

Although it has been assumed in the above embodiments that the receiver circuit processes a radio frequency signal in accordance with the low-IF reception technique, the receiver circuit may process the radio frequency signal in accordance with other IF reception techniques (e.g., zero IF reception etc.).

As described above, the aforementioned complex signal processing circuit can improve the accuracy of correction of the IQ imbalance, and therefore, is useful for audio/video reproduction devices, such as a mobile telephone, a digital television, etc., audio reproduction devices, such as a radio etc., etc.

Note that the above embodiments are merely exemplary in nature and are in no way intended to limit the scope of the present disclosure, its application, or uses.

What is claimed is:

1. A complex signal processing circuit for processing an analog complex signal including an in-phase signal and a quadrature signal, comprising:
    an analog complex filter configured to combine the in-phase signal with the quadrature signal and output the resultant signal as a first analog signal, and combine the quadrature signal with the in-phase signal and output the resultant signal as a second analog signal, to attenuate an image component contained in the analog complex signal;
    an analog-to-digital converter configured to convert the first and second analog signals into first and second digital signals;
    a first digital complex filter configured to apply a complex operation to the first and second digital signals to attenuate a component corresponding to the quadrature signal of the first digital signal and output the resultant signal as a third digital signal, and attenuate a component corresponding to the in-phase signal of the second digital signal and output the resultant signal as a fourth digital signal; and
    an IQ imbalance correction circuit configured to correct a quadrature error and an amplitude error between the third and fourth digital signals.

2. The complex signal processing circuit of claim 1, further comprising:
    a second digital complex filter configured to reject an image component contained in a digital complex signal including the third and fourth digital signals corrected by the IQ imbalance correction circuit.

3. The complex signal processing circuit of claim 2, wherein
    the second digital complex filter rejects the image component contained in the digital complex signal, and corrects an amplitude deviation of the digital complex signal in a desired frequency band.

4. The complex signal processing circuit of claim 3, wherein
    the second digital complex filter includes
        an image rejection filter configured to reject the image component contained in the digital complex signal, and
        a deviation correction filter configured to correct the amplitude deviation of the digital complex signal output from the image rejection filter in the desired frequency band.

5. The complex signal processing circuit of claim 1, further comprising:
    a control circuit configured to cause the analog complex filter and the first digital complex filter to be inactive when an image rejection ratio with respect to the analog complex signal is smaller than an input range of the analog-to-digital converter.

6. The complex signal processing circuit of claim 2, further comprising:
a control circuit configured to cause the second digital complex filter to be inactive when a difference in image component signal level between a digital complex signal input to the second digital complex filter and a digital complex signal output from the second digital complex filter is smaller than a predetermined value.

7. The complex signal processing circuit of claim 1, wherein $$|H1(s)H4(z)+H2(s)H3(z)|<|H2(s)|, \text{ and}$$

$$|H1(s)H4(z)+H2(s)H3(z)|<|H1(s)H3(z)-H2(s)H4(z)|$$

where $(H1(s)+jH2(s))$ is an analog transfer function of the analog complex filter, $(H3(z)+jH4(z))$ is an digital transfer function of the first digital complex filter, and j is the imaginary unit.

8. The complex signal processing circuit of claim 7, wherein $$H1(s)H4(z)+H2(s)H3(z)=0.$$

9. The complex signal processing circuit of claim 8, wherein
the real part $H3(z)$ of the digital transfer function corresponds to the real part $H1(z)$ of a transfer function obtained by applying the bilinear transform to the analog transfer function, and
the imaginary part $H4(z)$ of the digital transfer function corresponds to a value $(-H2(z))$ which is obtained by inverting the sign of the imaginary part $H2(z)$ of the transfer function which is obtained by applying the bilinear transform to the analog transfer function.

10. The complex signal processing circuit of claim 1, wherein
the analog complex signal is an intermediate frequency signal which is generated from a radio frequency signal in accordance with the low-IF reception technique.

11. A receiver circuit for demodulating data from a radio frequency signal, comprising:
a quadrature detector configured to convert the radio frequency signal into an analog complex signal;
the complex signal processing circuit of claim 1 configured to process the analog complex signal output from the quadrature detector to output a digital complex signal; and
a digital signal processing circuit configured to demodulate data based on the digital complex signal output from the complex signal processing circuit.

12. A signal reproduction device for receiving a radio frequency signal and reproducing at least one of video and audio, comprising:
the receiver circuit of claim 11 configured to demodulate data from the radio frequency signal; and
a reproduction circuit configured to reproduce at least one of video and audio based on the data demodulated by the receiver circuit.

* * * * *